US 6,563,686 B2

(12) United States Patent
Tsai et al.

(10) Patent No.: US 6,563,686 B2
(45) Date of Patent: May 13, 2003

(54) PEDESTAL ASSEMBLY WITH ENHANCED THERMAL CONDUCTIVITY

(75) Inventors: Cheng-Hsiung Tsai, Cupertino, CA (US); Karl Brown, San Jose, CA (US); Thomas Brezoczky, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/812,287

(22) Filed: Mar. 19, 2001

(65) Prior Publication Data

US 2002/0129475 A1 Sep. 19, 2002

(51) Int. Cl.[7] .............................................. H05E 23/00
(52) U.S. Cl. ........................................................ 361/234
(58) Field of Search ........................... 361/234; 438/14; 279/128; 219/497

(56) References Cited

U.S. PATENT DOCUMENTS

| 5,155,652 | A |   | 10/1992 | Logan et al. ............... 361/234 |
| 5,228,501 | A |   | 7/1993  | Tepman et al. ............. 165/80.1 |
| 5,507,499 | A |   | 4/1996  | Davenport et al. ............. 277/1 |
| 5,673,167 | A |   | 9/1997  | Davenport et al. ......... 361/234 |
| 6,072,163 | A | * | 6/2000  | Armstrong .................. 219/497 |
| 6,292,346 | B1 |  | 9/2001  | Ohno et al. .................. 361/234 |
| 6,377,437 | B1 | * | 4/2002 | Sexton ........................ 361/234 |

FOREIGN PATENT DOCUMENTS

| EP | 1 187 187   | 3/2002  | ......... H01L/21/205 |
| FR | 2 792 084   | 10/2000 | .......... G05D/23/19 |
| JP | 2000-40734  | 8/2000  | ........... H01L/21/68 |
| WO | WO 00/63955 | 10/2000 | ......... H01L/21/205 |

OTHER PUBLICATIONS

Gmelin, et al. "Thermal boundary resistance of mechanical contacts between solids at sub–ambient temperatures," IOP Publishing Ltd., XP–000888111, 1999, pp. R19–R43.
PCT Partial International Search Report from International Application No. PCT/US02/08373, Dated Sep. 19, 2002.
Gmelin, et al., "Thermal Boundary Resistance of Mechanical Contacts Between Solids at Sub–Ambient Temperatures", J. Physics D. Applied Physics, 32(6), 1999 (R19–R43).
International Search Report for corresponding PCT/US02/08373, dated Dec. 5, 2002.
Parkhe, Vijay "Apparatus for Controlling Temperature in a Semiconductor Processing System" U.S. patent application Ser. No. 09/707,043, filed Nov. 6, 2000.

* cited by examiner

Primary Examiner—John F. Niebling
Assistant Examiner—Andre C. Stevenson
(74) Attorney, Agent, or Firm—Moser, Patterson & Sheridan (57) ABSTRACT

A pedestal assembly for supporting a substrate within a semiconductor process chamber is provided. In one embodiment, the pedestal assembly generally includes a ceramic body, a metallic housing and a cooling plate. The ceramic body is coupled to the housing and is adapted to support the substrate. The cooling plate is disposed against the ceramic body. A conformal graphite interstitial layer disposed between the cooling plate and the ceramic body to provide enhanced thermal conductivity therebetween over a thermal operating range of the pedestal assembly. In another embodiment, a pedestal assembly generally includes a removable ceramic body disposed on a cover. A conformal graphite interstitial layer disposed in a vacuum environment surrounding the pedestal assembly between the ceramic body and the cover. Optionally, a second conformal graphite interstitial layer disposed in an internal volume of the pedestal assembly between the cooling plate and the cover.

34 Claims, 3 Drawing Sheets

PEDESTAL ASSEMBLY WITH ENHANCED THERMAL CONDUCTIVITY

BACKGROUND OF THE INVENTION

1. Field of the Invention

Embodiments of the invention generally relate to a pedestal assembly for supporting a substrate in a semiconductor processing chamber.

2. Description of the Related Art

Many semiconductor processes are typically performed in a vacuum environment. For example, physical vapor deposition (PVD) is generally performed in a sealed chamber having a pedestal for supporting the substrate disposed therein. The pedestal typically includes a ceramic support that has electrodes disposed therein to electrostatically hold the substrate against the ceramic support. A target generally comprised of a material to be deposited on the substrate is supported above the substrate, typically fastened to a top of the chamber. A plasma is formed from a gas such as argon that is supplied between the substrate and the target. The target is biased causing ions within the plasma to be accelerated toward the target. The ions impacting the target cause material to become dislodged from the target. The dislodged target material is attracted towards the substrate and deposits a film of material thereon.

Temperature control of the substrate during deposition is critical for good deposition performance. Generally, there are two areas of concern relating to temperature control of the substrate. The first concern is heat transfer between the substrate and the surface of the ceramic support, and the second is the thermal regulation of the ceramic support from within the pedestal. Generally, a backside gas, such as argon or helium, is used as a heat transfer medium between the substrate and the ceramic support.

The second concern is the thermal regulation of the ceramic support. Thermal regulation of the ceramic support from within the pedestal is generally provided by a metallic cooling plate located within the pedestal. In order to maximize the heat transfer between the cooling plate and the ceramic chuck, the mechanical contact area therebetween is maximized to limit the air gaps or voids therebetween. Promoting conductive heat transfer through materials having the solid to solid contact encourages higher heat transfer rates. Generally, thermal conduction through solid materials occurs at a higher rate in contrast to thermal transfer through air gaps or voids, including gaps induced by surface irregularities (flatness, roughness, etc.) in the mating surfaces.

A number of methods have been employed to maximize the solid to solid contact between the ceramic support and the cooling plate. Mechanically attaching the cooling plate to the ceramic support has not been found satisfactory due to the difference in the thermal expansion between the ceramic support and the cooling plate. For example, in applications such as copper PVD, the pedestal is exposed to a temperature range from about −40 to about 200 degrees Celsius. Solders, conductive adhesives and brazing cannot accommodate the difference in thermal expansion between the cooling plate and the ceramic support through such a wide temperature range. Moreover, when the mechanical attachment (i.e., braze, etc.) fails, the cooling plate typically becomes disengaged from the ceramic support, thereby severing the solid to solid conductive path.

Another method of enhancing the thermal conductivity between the cooling plate and the ceramic support is to provide a metallic foil such as aluminum therebetween. However, the foils generally do not lay flat against the cooling plate and the ceramic support surfaces. Moreover, gaps or voids are typically formed as the foil folds upon itself as the foil is compressed between the cooling plate and the ceramic support. The gaps decrease the rate of conductivity across the foil by reducing the solid to solid contact area across the width of the foil. Additionally, the concentrated thermal flux through the portions of the foil having solid to solid contact may be choked if the number of gaps are large, thus leading to a net decrease in the rate of heat transfer over systems not having a foil.

Yet another method of enhancing the thermal conductivity between the cooling plate and the ceramic support is to provide a thermally conductive paste or grease therebetween. However, the rate of conductivity across the grease is typically proportional to the loading between the ceramic support and the cooling plate. In order to provide good thermal conductivity, the load upon the ceramic support is typically high and disadvantageously stresses the ceramic support, thereby making the support susceptible to damage. Moreover, conductive greases are generally not vacuum compatible and are typically limited to applications where temperatures do not exceed about 300 degrees Celsius.

Therefore, there is a need for a pedestal having improved heat transfer characteristics.

SUMMARY OF THE INVENTION

A pedestal assembly for supporting a substrate in a semiconductor process chamber is provided. In one embodiment, the pedestal assembly generally includes a ceramic substrate support, a metallic housing and a cooling plate. The ceramic body is coupled to the housing and is adapted to support the substrate on a first surface. The cooling plate is disposed against at least a portion of a second surface of the ceramic substrate support. A conformal graphite interstitial layer is disposed between the cooling plate and the second surface of the ceramic substrate support. The conformal graphite layer provides enhanced thermal conductivity between the cooling plate and the ceramic substrate support over a thermal operating range of the pedestal assembly.

In another embodiment, a pedestal assembly for supporting a substrate in a semiconductor process chamber generally includes a ceramic substrate support, a metallic housing, a cover and a cooling plate. The housing and cover isolate an internal volume from a vacuum environment of the process chamber. The cooling plate is disposed in the internal volume against the cover. The ceramic substrate support is removably coupled to the cover and is adapted to support the substrate on a first surface. A conformal graphite interstitial layer is disposed between the ceramic substrate support and the cover in the vacuum environment of the chamber. Optionally, a second conformal graphite interstitial layer disposed in the internal volume between the cooling plate and the cover.

DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

The invention generally provides an interstitial material layer disposed between two materials to enhance the thermal conductivity therebetween. Although the invention is disclosed as an interstitial material layer disposed between a ceramic substrate support and a metallic cooling plate utilized in a physical vapor deposition chamber, the disclosure is one of illustration, and accordingly, the invention finds utility in other semiconductor processing chambers such as ion injection, chemical vapor deposition, etching and other applications where it is advantageous to enhance heat transfer between bodies having different rates of thermal expansion.

Figure 1:
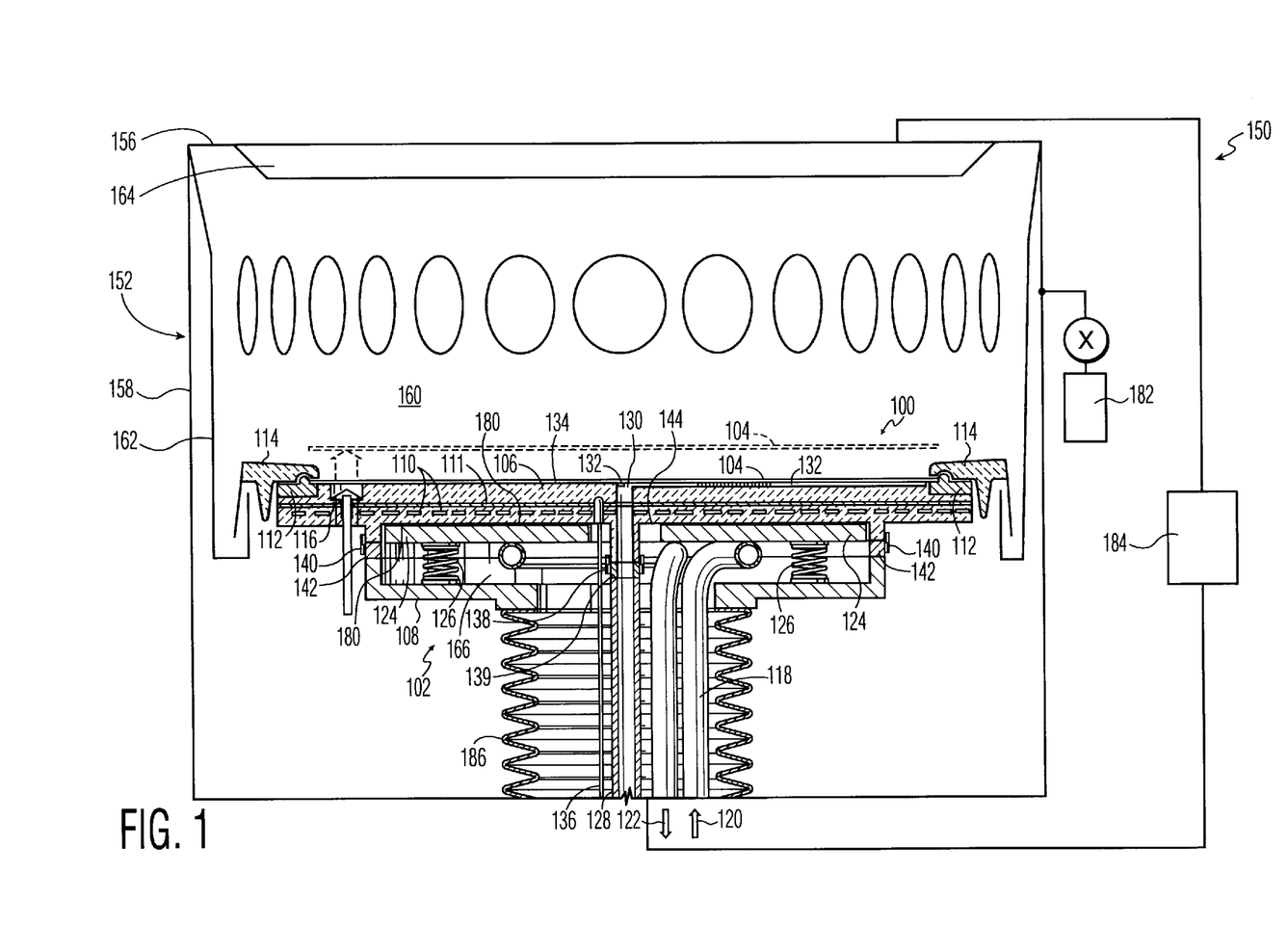
FIG. 1 depicts a semiconductor process chamber having one embodiment of a pedestal assembly disposed therein.

FIG. 1 depicts a semiconductor process chamber 150 having one embodiment of a pedestal assembly 100 disposed therein. Generally, the pedestal assembly 100 both supports and thermally regulates a substrate 104 disposed thereon during processing. One example of a process chamber that may be adapted to benefit from the invention is an IMP VECTRA™ PVD process chamber, available from Applied Materials, Inc., of Santa Clara, Calif.

The exemplary process chamber 150 includes a chamber body 152 having a bottom 154, lid 156 and sidewalls 158 that define an evacuable volume 160. The chamber body 150 is typically fabricated from a unitary block of aluminum. The sidewalls 158 generally contain a sealable port (not shown) to provide for entrance and egress of the substrate 104 from the process chamber 150. The lid 156 of the chamber 150 generally supports an annular shield 162 suspended therefrom that supports a shadow ring 114. The shadow ring 114 is generally configured to confine deposition to a portion of the substrate 104 exposed through the center of the shadow ring 114.

A target 164 is coupled to the lid 156 of the chamber body 152. The target 164 provides material which is deposited on the substrate 104 during the PVD process. The target 164 and pedestal assembly 100 are biased relative each other by a power source 184. A gas such as argon is supplied to the volume 160 from a gas source 182. A plasma is formed between the substrate 104 and the target 164 from the gas. Ions within the plasma are accelerated toward the target 164 and cause material to become dislodged from the target 164. The dislodged target material is attracted towards the substrate 104 and deposits a film of material thereon.

The pedestal assembly 100 is generally disposed on the bottom 154 of the chamber 150 and supports the substrate 104 during processing. The pedestal assembly 100 is coupled to the bottom 156 by a lift mechanism (not shown) that is configured to move the pedestal assembly 150 between an upper (as shown) and lower position. In the upper position, the substrate 104 is disposed on the pedestal assembly 100 and engages the shadow ring 114, lifting the shadow ring 114 from the shield 162.

In the lower position, the pedestal assembly 100 is positioned below the shield 162 which allows the substrate 104 to be removed from the chamber 150 through the port in the sidewall 158 while clearing the ring 114 and shield 162. Additionally, in the lower position, lift pins 116 are moved through the pedestal assembly 100 to space the substrate 104 from the pedestal assembly 100 to facilitate securing of the substrate 104 by a wafer transfer mechanism disposed exterior to the process chamber 150 such as a single blade robot (not shown). A bellows 186 is typically disposed between the pedestal assembly 100 and the chamber bottom 154 to isolate the chamber volume 160 from the interior of the pedestal assembly 100.

The pedestal assembly 100 generally includes a substrate support 102 sealingly coupled to a platform housing 108. The platform housing 108 is typically fabricated from a metallic material such as stainless steel or aluminum. A cooling plate 124 is generally disposed within the platform housing 108 to thermally regulate the substrate support 102. One pedestal assembly 100 that may be adapted to benefit from the invention is described in U.S. Pat. No. 5,507,499, issued Apr. 16, 1996 to Davenport et al., which is incorporated herein by reference in its entirety.

The substrate support 102 is typically comprised of ceramic and may be an electrostatic chuck, a ceramic body, a heater or a combination thereof. In one embodiment, the substrate support 102 is an electrostatic chuck that includes a dielectric body 106 having a conductive layer 111 embedded therein. The dielectric body 106 is typically fabricated from a high thermal conductivity dielectric material such as pyrolytic boron nitride, aluminum nitride, silicon nitride, alumina or an equivalent material.

Preferably, the dielectric body 106 contains embedded, electrically conductive heating elements 110 that can be used to heat the substrate support 102. Optionally, the substrate support 102 comprises a removable insert 112. The insert 112 is a recyclable element which is used to capture back-scattered deposition materials and to prevent the need to clean dielectric body 106. The insert 112 is constructed from a relatively inexpensive material having a coefficient of expansion similar to that of the dielectric material comprising the dielectric body 106.

The substrate 104 is thermally regulated by passing heat (i.e., thermal energy) between the substrate 104, dielectric body 106 and the cooling plate 124. Processing of the substrate 104 is generally carried out in a partial vacuum, wherein the absolute pressure of the chamber volume 160 is frequently as low as 0.1 mTorr. Thus, a backside gas is typically used to enhance heat transfer between the substrate 104 and the dielectric body 106. A conduit 128 is disposed through the pedestal assembly 100 to transfer the backside gas from a gas source (not shown) to a region defined between the dielectric body 106 and the substrate 104. The conduit 128 is attached to the dielectric body 106 by a seal 138. The conduit 128 supplies the backside gas through an opening 130 and into open channels 132 on an upper surface 134 of the support platen 106. Thermal energy is transferred from the substrate 104 across the backside gas to the dielectric body 106 (or, alternatively, in the reverse direction).

Thermal energy is added or removed from the dielectric body 106 by the cooling plate 124. The cooling plate 124 is generally disposed against a lower surface 144 of the dielectric body 102. The cooling plate 124 is typically fabricated from a material having good thermal conductivity to promote uniform heat transfer between the cooling plate 124 and the dielectric body 106. The cooling plate 124 is typically fabricated from copper, stainless steel, tungsten, molybdenum, or Kovar®. In an alternative embodiment of cooling plate 124, a layer of material having a low linear thermal expansion coefficient, such as tungsten, molybdenum, or Kovar® may be disposed on the side of the cooling plate 124 facing the lower surface 144 of the dielectric body 106.

A cooling coil 118 is generally disposed in or proximate the cooling plate 124. The cooling coil 118 is typically fabricated from aluminum, stainless steel or copper. The cooling coil 118 has a heat transfer fluid flowing therethrough supplied from a thermally regulated external fluid source (not shown). The heat transfer fluid enters the cooling coil 118 at a first port 120 and exits through a second port 122, thereby removing heat (or adding heat) to the cooling plate 124 as the first heat transfer fluid passes through the coil 118.

One or more springs 126 are disposed between the platform housing 108 and the cooling plate 124. The springs 126 biases the cooling plate 124 against the dielectric body 106 to maintain close contact between the dielectric body 106 and the cooling plate 124. Typically, the springs 126 load the cooling plate 124 against the substrate support 102 with about 5 to about 50 psi. Loads in excess of 50 psi may damage a brazed seal 140 disposed between the platform housing 108 and the dielectric body 106. To enhance the heat transfer between the cooling plate 124 and dielectric body 106, an interstitial material layer 180 is disposed therebetween.

Figure 2:
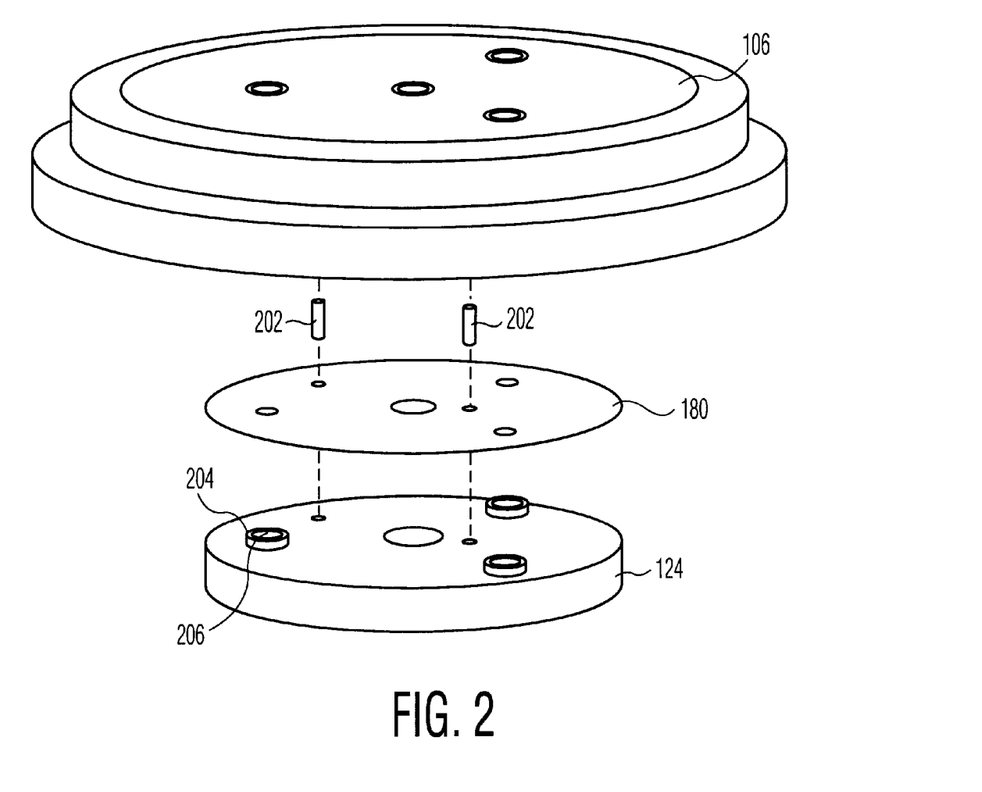
FIG. 2 is an exploded view of a portion of the pedestal assembly.

FIG. 2 depicts an exploded view of a portion of the pedestal assembly 150 showing the interstitial material layer 180. The interstitial material layer 180 is generally comprised of a conformal material having good conductivity. The interstitial material layer 180 is conformal to irregular solid surfaces and shows no relaxation during thermal cycling. An example of one material suitable for use as an interstitial material layer 180 is graphite. A thickness of about 250 to about 500 microns has shown good thermal characteristics and surface compliance (i.e., compensates for surface waviness and roughness of the platform housing 108 and the dielectric body 106) under loads of less than about 50 psi. As the interstitial material layer 180 is subjected to high temperatures, binders within the graphite must be suitable for use at temperatures in excess of about 400 degrees Celsius. Alternatively, pure graphite (i.e., graphite without or with limited amounts of binders) may be utilized.

To prevent rotation of the interstitial material layers 180, one or more pins 202 may optionally be disposed through the in the interstitial material layers 180 and one or both of the dielectric body 106 or cooling plate 124. Alternatively, interstitial material layers 180 may be located in other ways, such as for example, a boss 204 projecting from one or more lift pin holes 206. When utilized, the boss 204 must have a height less than the compressed thickness of the interstitial material layer 180 to allow the interstitial material layer 180 to conform under the bias load.

Other interstitial material layers 180 having properties similar to graphite may be alternatively utilized. Generally, the interstitial material layer 180 has a minimum conductivity of about 20 W/m° K in the lateral plane to avoid restricting the heat flux while transmitting thermal energy through the thickness of the interstitial material layer 180. In one embodiment, the interstitial material layer 180 has a contact resistance less than about $1 \times 10^{-4}$ $K(m^2/W)$ when under a load of less than about 50 psi.

Referring back to FIG. 1, a thermocouple 136 is disposed in the dielectric body 106. The thermocouple 136 senses the temperature of the substrate 104 and transfers information to a controller which causes either heating of the dielectric body 106 by electrically conductive elements 110 or cooling of the dielectric body 106 via the cooling plate 124 and the cooling coil 118.

To further enhance the heat transfer between the cooling coil 118, the cooling plate 124, and the dielectric body 106 in an interior volume 166 of the pedestal assembly 150, a heat transfer fluid (in the form of a gaseous atmosphere) is supplied between the cooling coil 118, the cooling plate 124 and the lower surface 144 of the dielectric body 106 exposed to the internal volume 166 of the pedestal assembly 106. The heat transfer fluid is typically argon, helium, nitrogen or air. To enable use of the heat transfer fluid, it is necessary to be able to isolate the internal volume 166 of the pedestal assembly 150 confining the heat transfer fluid from the volume 160 of the chamber 150 in which the substrate 104 is processed.

The brazed seal 140 is typically disposed between the substrate support 102 and platform housing 108 to isolate the interior volume 166 of the pedestal assembly 100 from the environment of the volume 160 of the process chamber 150. The seal 138 additionally isolates the interior volume 166 from the backside gas traveling in the conduit 128. As the interior volume 166 of the pedestal assembly 100 is isolated from the vacuum environment 160 of the process chamber 150, the problems associated with thermal transfer across the interstitial voids between the cooling plate 124 and substrate support 102 in a vacuum atmosphere are avoided.

The seals 138 and 140 are typically comprised of a thin, metal-comprising strip or ribbon. The seal 138 is braised at one edge to the surface of the dielectric body 106 and at the other edge to either the conduit 128. The seal 140 is braised at one edge to the dielectric body 106 and at the other edge to the platform housing 108. The seals 138 and 140 should be capable of withstanding a pressure differential of about 15 psi over an operational temperature range of the pedestal assembly 100 which is from about –80° C. to about 400° C.

In embodiments where the dielectric body 106 is fabricated from alumina or aluminum nitride, it is preferable to utilize extensions 139 and 142, respectively, in concert with the seals 138 and 140. The extensions 139 and 142 minimize stress created due to the differences in thermal expansion between the dielectric body 106 and the housing 108.

For example, pyrolytic boron nitride has a thermal coefficient of expansion across its planar length and width directions of about $1.5 \times 10^{-3}$ in./in./° C. at 600° C. Aluminum nitride has a thermal expansion coefficient of $0.01 \times 10^{-3}$ in./in./° C. at 600° C. The conduit 128 is attached to dielectric body 106 is constructed from a material such as stainless steel or copper which have a linear thermal expansion coefficient at about 600° C. ranging from about $6.8 \times 10^{-3}$ to $12 \times 10^{-3}$ in./in./° C. The platform housing 108 is constructed from materials that generally have a linear thermal expansion coefficient ranging from about $6.8 \times 10^{-3}$ in./in./° C. at about 600° C. The difference in linear thermal coefficient of expansion across seals 138 and 140 when alumina or aluminum nitride comprises the dielectric body 106 is compensated by welding the extension 139 to the conduit 128 and the extension 142 to the platform housing 108. The extensions 139, 142 typically are comprised of a material having a linear thermal coefficient of expansion in the range of about $2 \times 10^{-3}$ in./in./° C. at about 600° C. The seals 138 and 140 are brazed between the dielectric body 106 and the respective extension 139, 142. Materials which have a linear thermal expansion coefficient in this range and which can be used to form extensions 139 and 142 include, but are not limited to, molybdenum, tantalum, titanium, tungsten and Kovar®. Since there is not a crucial amount of heat transferred between the extension 139 and the conduit 128 or between the extension 142 and the platform housing 108, the extensions can be welded to the conduit 128 and the platform housing 108 without creating any significant thermal expansion problem. A detailed description of the seals 138, 140 and extensions 139, 142 are provided in the previously incorporated U.S. Pat. No. 5,735,339 to Davenport et al.

Figure 3:
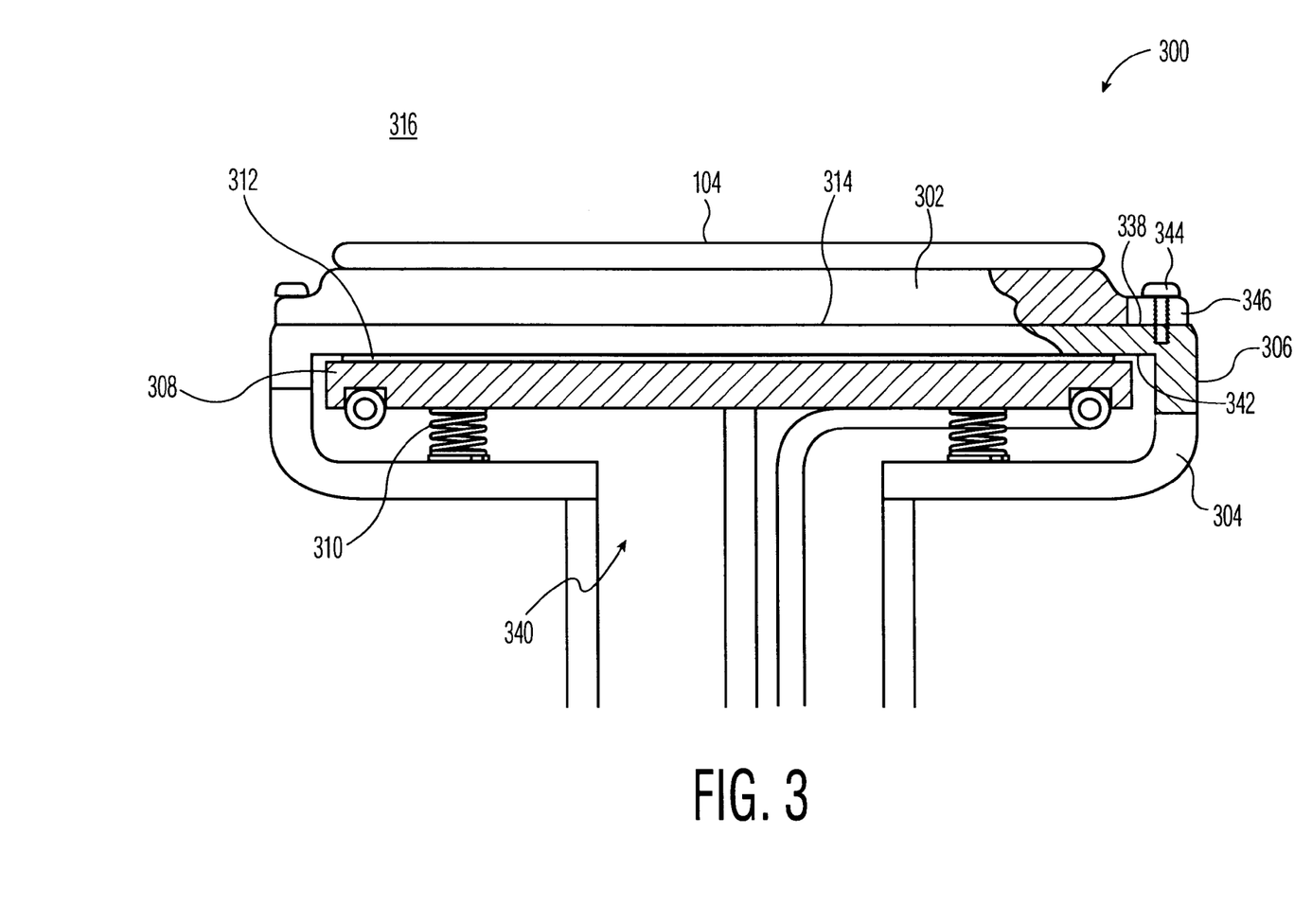
FIG. 3 depicts another embodiment of a pedestal assembly.

FIG. 3 depicts another embodiment of a pedestal assembly 300. Generally, the pedestal assembly 300 includes a dielectric body 302, a platform housing 304 and a platform cover 306. The platform housing 304 and platform cover 306 are sealingly coupled to isolate an interior volume 340 of the pedestal assembly 300 from an environment 316 (e.g., the chamber environment) disposed exterior to the pedestal assembly 300. The pedestal assembly 300 is substantially similar to the pedestal assembly 100 described with reference to FIG. 1 except that the dielectric body 302 is removable from the pedestal assembly 300.

Typically, a cooling plate 308 is disposed within the pedestal assembly 300. The cooling plate 308 is generally similar to the cooling plate 124. The cooling plate 308 is biased by a plurality of springs 310 against a lower surface 342 of the platform cover 306.

The dielectric body 302 is removably disposed on an upper surface 338 of the platform cover 306. The dielectric body 302 may be retained to the platform cover 306 by electrostatics, vacuum, removable adhesive, screws or clamps. In one embodiment, the dielectric body 302 is retained to the platform cover 306 by a plurality of screws 344. The screws 344 respectively pass through a slot 346 in the dielectric body 302 to allow for thermal expansion between the dielectric body 302 and the platform cover 306 (typically the same material as the platform housing 304) without damaging the dielectric body 302.

A first interstitial material layer 314 is deposed between the dielectric body 302 and the platform cover 306. The first interstitial material layer 314 generally has similar properties as the interstitial material layer 180. Since the first interstitial material layer 314 is exposed to the vacuum environment exterior to the pedestal assembly 300 and is remote from the cooling plate 308, the second interstitial material layer 314 additionally must be vacuum compatible and exhibit no creep during elevated temperature operation, for example, at least about 150 degrees Celsius.

Optionally, a second interstitial material 312 is disposed between the cooling plate 308 and the platform cover 306 to enhance thermal transfer therebetween. The second interstitial material 312 is generally similar to the interstitial material 180 described with reference to FIG. 1.

While the foregoing is directed to the preferred embodiment of the present invention, other and further embodiments of the invention may be devised without departing from the basic scope thereof, and the scope thereof is determined by the claims that follow.

What is claimed is:

1. A substrate support pedestal assembly for supporting a substrate in a semiconductor process chamber comprising:
a ceramic substrate support having a first surface and a second surface, the second surface adapted to support the substrate;
a metallic housing coupled to the ceramic substrate support;
a cooling plate disposed against at least a portion of the first surface of the ceramic substrate support; and
a conformal graphite interstitial layer disposed between the cooling plate and the first surface of the ceramic substrate support, wherein the graphite interstitial layer has a minimum conductivity of 20 W/m° K in a plane parallel to the cooling plate.

2. A substrate support pedestal assembly for supporting a substrate in a semiconductor process chamber comprising:
a ceramic substrate support having a first surface and a second surface, the second surface adapted to support the substrate;
a metallic housing sealingly coupled to the ceramic substrate support isolating a gaseous heat transfer fluid disposed therebetween from a vacuum environment of the processing chamber;
a cooling plate disposed against at least a portion of the first surface of the ceramic substrate support; and
a conformal interstitial layer disposed between the cooling plate and the first surface of the ceramic substrate support, the interstitial layer having a contact resistance of less than about $1\times10^{-4°}$ K(m$^2$/W) when under a load of less than about 50 psi and a minimum conductivity of 20 W/m° K in a plane parallel to the cooling plate.

3. The pedestal assembly of claim 1, wherein the interstitial layer has a thickness of between about 250 to about 500 microns.

4. The pedestal assembly of claim 1, wherein the cooling plate is biased against the ceramic substrate support by a force less than less than about 50 psi.

5. The pedestal assembly of claim 1, wherein the bias force is provided by one or more springs disposed between the cooling plate and the housing.

6. The pedestal assembly of claim 2, wherein the ceramic substrate support is a heater, a susceptor or an electrostatic chuck.

7. The pedestal assembly of claim 2, wherein the pedestal assembly has an operating temperate in the range of about −80 to about 400 degrees Celsius.

8. A substrate support pedestal assembly for supporting a substrate in a semiconductor process chamber comprising:
a housing;
a cover coupled to the housing and having a first surface and a second surface, the cover and the housing isolating an internal volume from a vacuum environment defined by the process chamber;
a cooling plate disposed within the internal volume and at least partially against the second surface of the cover;
a ceramic substrate support removably disposed on the first surface and adapted to support the substrate; and
a conformal graphite interstitial layer disposed in the vacuum environment between the ceramic substrate support and the first surface of the cover, wherein the graphite interstitial layer has a minimum conductivity of 20 W/m° K in a plane parallel to the cooling plate.

9. The pedestal assembly of claim 8, wherein the graphite interstitial layer has a contact resistance of less than $1\times10^{-4°}$ K(m$^2$/W) when under a load of less than about 50 psi.

10. The pedestal assembly of claim 8, wherein the graphite interstitial layer has a thickness of between about 250 to about 500 microns.

11. The pedestal assembly of claim 8, wherein the ceramic substrate support is a heater, a susceptor or an electrostatic chuck.

12. The pedestal assembly of claim 8, further comprising a second graphite interstitial layer disposed between the cover and the cooling plate.

13. The pedestal assembly of claim 8, wherein the pedestal assembly has an operating temperate in the range of about −80 to about 400 degrees Celsius.

14. The pedestal assembly of claim 1, wherein the graphite interstitial layer has a contact resistance of less than about $1\times10^{-4°}$ $K(m^2/W)$ when under a load of less than about 50 psi.

15. The pedestal assembly of claim 1, wherein the graphite interstitial layer has a thickness of between about 250 to about 500 microns.

16. The pedestal assembly of claim 1, wherein the cooling plate is biased against the ceramic substrate support.

17. The pedestal assembly of claim 16, wherein the biased force is less than a out 50 psi.

18. The pedestal assembly of claim 1, further comprising one or more springs disposed between the cooling plate and the housing, the springs biasing the cooling plate against the ceramic substrate support.

19. The pedestal assembly of claim 1, wherein the ceramic substrate support is a heater, a susceptor or an electrostatic chuck.

20. The pedestal assembly of claim 1, further comprising a vacuum seal between the housing and the ceramic substrate support.

21. The pedestal assembly of claim 1, wherein the pedestal assembly has an operating temperate in the range of about −80 to about 400 degrees Celsius.

22. A substrate support pedestal assembly for supporting a substrate in a semiconductor process chamber comprising:
   a ceramic substrate support having a first surface and a second surface, the second surface adapted to support the substrate;
   a metallic housing coupled to the ceramic substrate support;
   a cooling plate disposed against at least a portion of the first surface of the ceramic substrate support; and
   a conformal graphite interstitial layer disposed between the cooling plate and the first surface of the ceramic substrate support, wherein the graphite interstitial layer has a thickness of between about 250 to about 500 microns.

23. The pedestal assembly of claim 22, wherein the graphite interstitial layer has a contact resistance of less than about $1\times10^{-4°}$ $K(m^2/W)$ when under a load of less than about 50 psi.

24. The pedestal assembly of claim 22, wherein the cooling plate is biased against the ceramic substrate support.

25. The pedestal assembly of claim 22, wherein the biased force is less than about 50 psi.

26. The pedestal assembly of claim 22, further comprising one or more springs disposed between the cooling plate and the housing, the springs biasing the cooling plate against the ceramic substrate support.

27. The pedestal assembly of claim 22, wherein the ceramic substrate is a heater, a susceptor or an electrostatic chuck.

28. The pedestal assembly of claim 22, further comprising a vacuum seal between the housing and the ceramic substrate support.

29. The pedestal assembly of claim 22, wherein the pedestal assembly has an operating temperate in the range of about −80 to about 400 degrees Celsius.

30. A substrate support pedestal assembly for supporting a substrate in a semiconductor process chamber comprising:
   a housing;
   a cover coupled to the housing and having a first surface and a second surface, the cover and the housing isolating an internal volume from a vacuum environment defined by the process chamber;
   a cooling plate disposed within the internal volume and at least partially against the second surface of the cover;
   a ceramic substrate support removably disposed on the first surface and adapted to support the substrate; and
   a conformal graphite interstitial layer disposed in the vacuum environment between the ceramic substrate support and the first surface of the cover, wherein the graphite interstitial layer has a thickness of between about 250 to about 500 microns.

31. The pedestal assembly of claim 30, wherein the graphite interstitial layer has a contact resistance of less than $1\times10^{-4°}$ $K(m^2/W)$ when under a load of less than about 50 psi.

32. The pedestal assembly of claim 30, wherein the ceramic substrate support is a heater, a susceptor or an electrostatic chuck.

33. The pedestal assembly of claim 30, further comprising a second graphite interstitial layer disposed between the cover and the cooling plate.

34. The pedestal assembly of claim 30, wherein the pedestal assembly has an operating temperate in the range of about −80 to about 400 degrees Celsius.

* * * * *

UNITED STATES PATENT AND TRADEMARK OFFICE
CERTIFICATE OF CORRECTION

PATENT NO. : 6,563,686 B2  
DATED : May 13, 2003  
INVENTOR(S) : Tsai et al.

It is certified that error appears in the above-identified patent and that said Letters Patent is hereby corrected as shown below:

<u>Column 5,</u>
Line 51, please delete "in the".

<u>Column 7,</u>
Line 42, please change "deposed" to -- disposed --.

<u>Column 9,</u>
Line 17, please change "a out 50" to -- about 50 --.

Signed and Sealed this

Eighteenth Day of November, 2003

JAMES E. ROGAN  
*Director of the United States Patent and Trademark Office*

UNITED STATES PATENT AND TRADEMARK OFFICE
CERTIFICATE OF CORRECTION

PATENT NO.    : 6,563,686 B2
DATED         : May 13, 2003
INVENTOR(S)   : Tsai et al.

It is certified that error appears in the above-identified patent and that said Letters Patent is hereby corrected as shown below:

Column 5,
Line 51, please delete "in the".

Column 7,
Line 42, please change "deposed" to -- disposed --.

Column 9,
Line 17, please change "a out 50" to -- about 50 --.

Signed and Sealed this

Thirtieth Day of November, 2004

JON W. DUDAS
*Director of the United States Patent and Trademark Office*

UNITED STATES PATENT AND TRADEMARK OFFICE
CERTIFICATE OF CORRECTION

PATENT NO. : 6,563,686 B2
APPLICATION NO. : 09/982287
DATED : May 13, 2003
INVENTOR(S) : Tsai et al.

It is certified that error appears in the above-identified patent and that said Letters Patent is hereby corrected as shown below:

Column 5
Line 51, please delete "in the".

Column 7
Line 42, please change "deposed" to -- disposed --.

Column 9
Line 17, please change "a out 50" to -- about 50 --.

Signed and Sealed this

Eighteenth Day of March, 2008

JON W. DUDAS
*Director of the United States Patent and Trademark Office*